United States Patent
Neumann et al.

(10) Patent No.: US 11,158,991 B2
(45) Date of Patent: Oct. 26, 2021

(54) COVER FOR AN OPTOELECTRONIC COMPONENT AND OPTOELECTRONIC DEVICE

(71) Applicant: OSRAM Opto Semiconductors GmbH, Regensburg (DE)

(72) Inventors: Wolfgang Neumann, Regensburg (DE); Jörn Kampmeier, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 79 days.

(21) Appl. No.: 16/495,193

(22) PCT Filed: May 9, 2018

(86) PCT No.: PCT/EP2018/062134
§ 371 (c)(1),
(2) Date: Sep. 18, 2019

(87) PCT Pub. No.: WO2018/206717
PCT Pub. Date: Nov. 15, 2018

(65) Prior Publication Data
US 2020/0144785 A1    May 7, 2020

(30) Foreign Application Priority Data
May 12, 2017   (DE) .................... 10 2017 110 317.1

(51) Int. Cl.
*H01S 5/022*    (2021.01)
*H01L 33/48*    (2010.01)
(Continued)

(52) U.S. Cl.
CPC ........ *H01S 5/02216* (2013.01); *H01L 33/486* (2013.01); *H01S 5/02257* (2021.01); *H01L 2933/0033* (2013.01)

(58) Field of Classification Search
None
See application file for complete search history.

(56) References Cited

U.S. PATENT DOCUMENTS 9,595,806 B2 *   3/2017   Tazawa ............... H01S 5/02345
2009/0294789 A1   12/2009  Yoshida
(Continued)

FOREIGN PATENT DOCUMENTS

DE   10 2009 022 724 A1   12/2009
DE   10 2010 008 605 A1   8/2011
(Continued)

OTHER PUBLICATIONS

Notice of Reasons for Rejection dated Oct. 20, 2020, of counterpart Japanese Application No. 2019-562330, along with an English translation.

*Primary Examiner* — Robert K Carpenter
(74) *Attorney, Agent, or Firm* — DLA Piper LLP (US)

(57) ABSTRACT

A cover for an optoelectronic component includes a body of a first material, the body includes a lower side and, starting from the lower side, a recess for the optoelectronic component, the body includes a side surface adjacent to the lower side, the recess is continued as far as the side surface, a plate of a second material is arranged on the side surface, the second material being transparent for a radiation wavelength of the optoelectronic component, and the body and the plate are connected.

10 Claims, 5 Drawing Sheets

(51) Int. Cl.
    *H01S 5/02216*     (2021.01)
    *H01S 5/02257*     (2021.01)

(56)            References Cited

U.S. PATENT DOCUMENTS

2009/0296417 A1   12/2009   Luo et al.
2009/0296418 A1   12/2009   Luo et al.
2013/0292735 A1   11/2013   Höppel
2015/0034987 A1    2/2015   Hayashi et al.
2016/0268770 A1    9/2016   Tazawa et al.

FOREIGN PATENT DOCUMENTS

GB       2 498 347 A      7/2013
JP       2009-289749 A   12/2009
JP       2009-289775 A   12/2009
JP       2011-82590 A     4/2011
WO       2012/080015 A1   6/2012

* cited by examiner

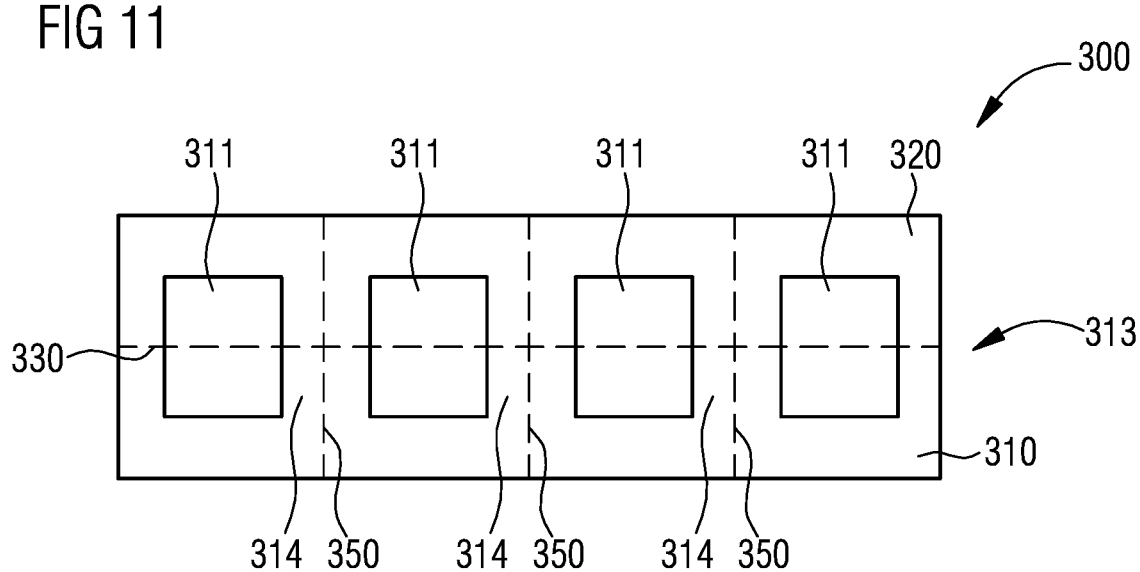
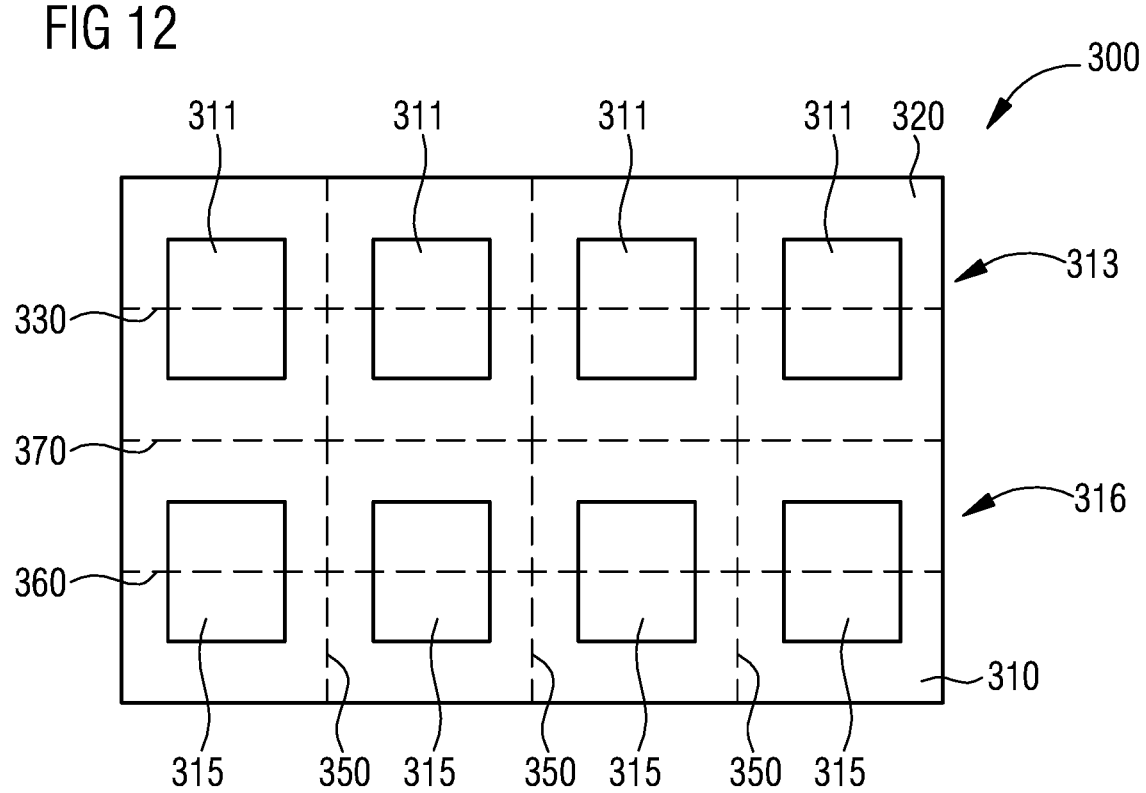

COVER FOR AN OPTOELECTRONIC COMPONENT AND OPTOELECTRONIC DEVICE

TECHNICAL FIELD

This disclosure relates to a cover for an optoelectronic component, an optoelectronic device, a method of producing a cover for an optoelectronic component, and a method of producing an optoelectronic device.

BACKGROUND

Optoelectronic components, in particular light-emitting diodes or laser diodes, are currently provided with housings in which a light-emitting semiconductor chip is mounted in a housing, so-called through-hole mounting being carried out. The devices then have two or more pins with which electrical contacting can be carried out. Those devices are unsuitable for surface mounting, for example, in SMD technology.

It could therefore be helpful to provide an improved cover for an optoelectronic component, an optoelectronic component having such a cover that may additionally be suitable for surface mounting, produce the cover and the optoelectronic component and an optoelectronic device.

SUMMARY

We provide a cover for an optoelectronic component, wherein the cover includes a body of a first material, the body includes a lower side and, starting from the lower side, a recess for the optoelectronic component, the body includes a side surface adjacent to the lower side, the recess is continued as far as the side surface, a plate of a second material is arranged on the side surface, the second material being transparent for a radiation wavelength of the optoelectronic component, and the body and the plate are connected.

We also provide an optoelectronic device having an optoelectronic component on a substrate, additionally including the cover for an optoelectronic component, wherein the cover includes a body of a first material, the body includes a lower side and, starting from the lower side, a recess for the optoelectronic component, the body includes a side surface adjacent to the lower side, the recess is continued as far as the side surface, a plate of a second material is arranged on the side surface, the second material being transparent for a radiation wavelength of the optoelectronic component, and the body and the plate are connected, wherein the lower side of the cover is adjacent to the substrate and the optoelectronic component is arranged in the recess.

We further provide a method of producing a cover for an optoelectronic component including providing a first material, the first material including a cavity, the cavity starting from a first side of the first material, applying and fastening a plate on the first side of the first material, the plate consisting of a second material and being transparent for at least one radiation wavelength, and making a first saw cut such that the cavity is separated into two regions, the first saw cut being carried out both through the first material and through the plate.

We still further provide a method of producing an optoelectronic device including providing a substrate having an optoelectronic component, producing the cover for an optoelectronic component including providing a first material, the first material including a cavity, the cavity starting from a first side of the first material, applying and fastening a plate on the first side of the first material, the plate consisting of a second material and being transparent for at least one radiation wavelength, and making a first saw cut such that the cavity is separated into two regions, the first saw cut being carried out both through the first material and through the plate, and placing and fastening the cover on the substrate such that the optoelectronic component is arranged inside the cavity.

BRIEF DESCRIPTION OF THE DRAWINGS

FIG. 11 schematically shows a further intermediate product of the method of producing a cover.

FIG. 12 schematically shows a further intermediate product of the method of producing a cover.

Figure 1:
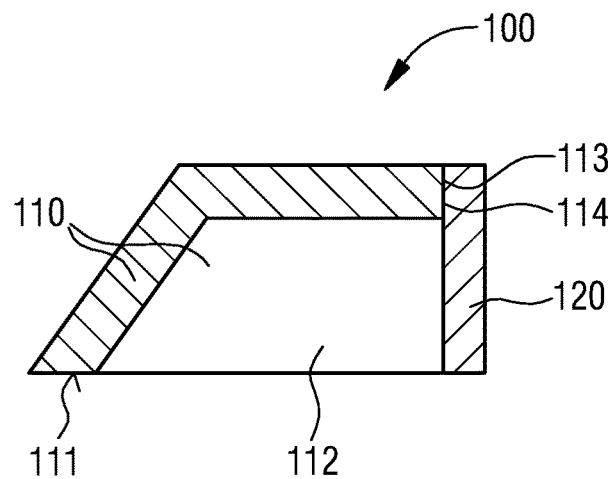
FIG. 1 schematically shows a cross section through a cover.

LIST OF REFERENCES 100 cover
110 body
111 lower side
112 recess
113 side surface
114 first connecting region
116 further side surface
120 plate
125 further plate
200 optoelectronic device
210 substrate
211 second connecting region
220 optoelectronic component
221 light exit side
222 backside
223 further optoelectronic component
230 carrier
300 intermediate product
310 first material
311 cavity
312 first side
313 first row
314 first web
315 cavity
316 second row
317 second side
320 plate
325 further plate 330 first saw cut
335 further plane
340 second saw cut
350 second saw cut
360 third saw cut
370 fourth saw cut

DETAILED DESCRIPTION

A cover for an optoelectronic component comprises a body of a first material. The body comprises a lower side and, starting from the lower side, a recess for the optoelectronic component. The body furthermore comprises a side surface adjacent to the lower side. The recess is continued as far as the side surface. A plate of a second material is arranged on the side surface, the second material being transparent for a radiation wavelength of the optoelectronic component. The body and the plate are connected. The plate of the second material is in this example used as a window, or as an extraction element for light or electromagnetic radiation of the optoelectronic component. Such a cover may be positioned simply onto a substrate having an optoelectronic component, the optoelectronic component in this example being placed inside the recess. Furthermore, such a cover is simple to produce. The connecting may in this example be carried out with a force-fit.

The body may have a planar lower side and a planar side surface. In this way, on the one hand, the plate may be fastened simply on the side surface, and on the other hand the cover may be positioned simply onto a substrate having an optoelectronic component.

The body may be a cuboid. A cuboid body may be used simply to provide a cover for an optoelectronic component since a cuboid body can be produced from a larger material piece by simple saw cuts.

The body may comprise glass or silicon. The silicon may be present, for example, as silicon dioxide or as pure silicon. The body may thus be transparent or nontransparent for the radiation of the light-emitting component.

The plate may comprise glass. In this way, simple extraction of the light of the optoelectronic component can be achieved.

A first connecting region may be arranged between the first material of the body and the second material of the plate. A connection consisting of the first and the second material may be arranged in the first connecting region. This connection consisting of the first material and the second material may, for example, be produced by melting the interface between the first material and the second material, the melts being mixed and the connection consisting of the two materials subsequently being produced.

Alternatively, a metal may be arranged in the connecting region, in which the metal may, for example, be used as a solder for a soldered connection between the first material and the second material. The metal may thus be melted, the molten metal connecting firmly to the first material and the second material and thus providing a force-fit connection.

Furthermore, in the first connecting region, a first space-charge zone may be arranged in the first material and a second space-charge zone may be arranged in the second material. The first and the second space-charge zones are oppositely charged, and thus lead to electrostatic attraction of the space-charge zones to one another. In this way, a force-fit connection is achieved between the first material and the second material.

Alternatively, hydrogen bonds may be formed in the first connecting region. Because of the hydrogen bonds, the first material adheres to the second material and the materials thus connect to one another with a force-fit.

The aforementioned possibilities of forming the first connecting region allow simple production of the cover consisting of a first material and a second material.

An optoelectronic device comprises an optoelectronic component on a substrate and a cover of one of the examples. The lower side of the cover is adjacent to the substrate and the optoelectronic component is arranged in the recess of the cover. The optoelectronic component is in this example arranged inside the recess such that a light exit surface of the optoelectronic component is oriented toward the plate of the cover and thus light or electromagnetic radiation leaving the optoelectronic component can leave the optoelectronic device through the plate of the cover.

The substrate and the cover may be connected, in particular with a force-fit.

A second connecting region may be arranged between the substrate and the cover, a connection consisting of a material of the substrate and of the first or the second material being arranged, or a metal being arranged, in the second connecting region. The connection may thus be carried out on the substrate by melting the material of the substrate and the cover in the second connecting region, or by soldering by a metal between the substrate and the cover.

The substrate may comprise solder pads on a side facing away from the cover so that surface mounting of the optoelectronic device is made possible. The optoelectronic device may thus be configured as a so-called SMD device.

A method of producing a cover for an optoelectronic component comprises the following steps:

Providing a first material, the first material comprising a cavity. The cavity starts from a first side of the first material.

Applying and fastening, in particular force-fit fastening, a plate on the first side of the first material, the plate consisting of a second material and being transparent for at least one radiation wavelength.

Making a first saw cut such that the cavity is separated into two regions, the first saw cut in this example being carried out both through the first material and through the plate.

The cavity originally present in the first material is thus completely closed by the application and fastening of the transparent plate. Subsequently, a saw cut is made such that the cavity is divided into two regions and a cover for an optoelectronic component is thus formed, on which the first material may form a body and a transparent plate is laterally adjacent to a recess and is suitable for the extraction of electromagnetic radiation.

Further saw cuts may be provided, with which the first material is brought into a predetermined shape.

It may be provided that the first saw cut divides the cavity exactly in the middle and thus that two identical covers are formed.

Two covers, each for one optoelectronic component, may thus be formed from one cavity of the first material.

The first saw cut may be carried out perpendicularly to the first side.

The first material may comprise a plurality of cavities in a first row. First webs between the cavities delimit the cavities from one another. The first saw cut is made through the cavities of the first row such that the first saw cut divides the cavities respectively into two regions. An intermediate product is thus formed, in which the cavities are respectively divided into two regions, although a larger number of these regions of the cavities are also arranged adjacent to one another in the intermediate product. By at least one second saw cut through one of the first webs, the intermediate product is separated into the individual covers. The second saw cut is in this example not made through one of the cavities of the first row. With this method, a large number of covers may be produced efficiently.

The first material may comprise a plurality of cavities in a second row, in addition to the cavities of the first row. A third saw cut may be made through the cavities of the second row.

A further saw cut may be carried out through connecting elements between the cavities of the first row and the cavities of the second row parallel to the first and the third saw cuts.

A large number of covers may thus be produced simply and economically on a first material present in flat form with a plurality of columns and rows of cavities.

The force-fit connection between the first material and the plate may be produced by melting by a laser the first material and the second material, bearing on the first material, at an interface between the first material and the second material. A melt resulting therefrom is then solidified during cooling as a connection between the first material and the second material and formed from a material mixture of the first material and the second material. The solidified melt in this example connects the first material and the plate with a force-fit.

The force-fit connection between the first material and the plate may be produced by arranging a metal between the first material and the plate. The metal is melted and subsequently solidifies as a connection between the first material and the second material. The first material and the second material are thus soldered to one another by the metal.

The force-fit connection between the first material and the plate may be produced by heating the first material and the second material, bearing on the first material, of the plate. A voltage is subsequently applied between the first material and the plate while the materials are being heated. Because of the voltage, electrons are displaced from the first material into the plate or from the plate into the first material. During subsequent cooling, during which the voltage continues to be applied, oppositely charged space-charge zones are formed in the first material and respectively in the plate because of the displaced electrons. The space-charge zones lead to mutual electrostatic attraction of the first material and the plate, and therefore to the force-fit connection.

The force-fit connection between the first material and the plate may be produced by polishing the first material on the first side and the plate on the side facing toward the first material. The polished sides of the first material and the plate may subsequently be applied onto one another. Hydrogen bonds leading to a force-fit connection may be formed between the first material and the second material of the plate because of a low roughness of the two sides due to the polishing.

Besides the method steps of producing the cover, a method of producing an optoelectronic device comprises provision of a substrate having an optoelectronic component, and placement and fastening of the cover on the substrate such that the optoelectronic component is arranged inside the cavity.

The cover may in this example be fastened on the substrate by a laser-welding process or soldering process. In the laser-welding process, the respective material of the substrate and the cover is again melted at an interface between the substrate and the cover by laser radiation, and solidifies to form a connection consisting of the two materials. The soldering process may be carried out such that a metal is again arranged between the substrate and the cover and melted.

Both methods can be carried out best with a laser-heating process since, because of the selective heating of a small subregion of the interface between the substrate and the cover, only minor thermal input takes place into the optoelectronic component itself, and the likelihood of damage to the optoelectronic component can thus be reduced.

The above-described properties, features and advantages and the way in which they are achieved, will become more clearly and readily comprehensible in conjunction with the following description of the examples, which will be explained in more detail in connection with the drawings.

FIG. 1 shows a cross section through a cover 100 for an optoelectronic component. The cover 100 comprises a body 110 of a first material. The body 110 comprises a lower side 111 and, starting from the lower side 111, a recess 112. The recess 112 is provided to receive the optoelectronic component when the cover 100 is fitted in an optoelectronic device. The body 110 furthermore comprises a side surface 113 adjacent to the lower side 111. The recess 112 is continued as far as the side surface 113. A plate 120 of a second material is arranged on the side surface 113. The second material is transparent for a radiation wavelength of the optoelectronic component. The body 110 and the plate 120 connect to one another. A connecting region 114 may be provided between the body 110 and the plate 120. The connecting may be configured with a force-fit.

Figure 2:
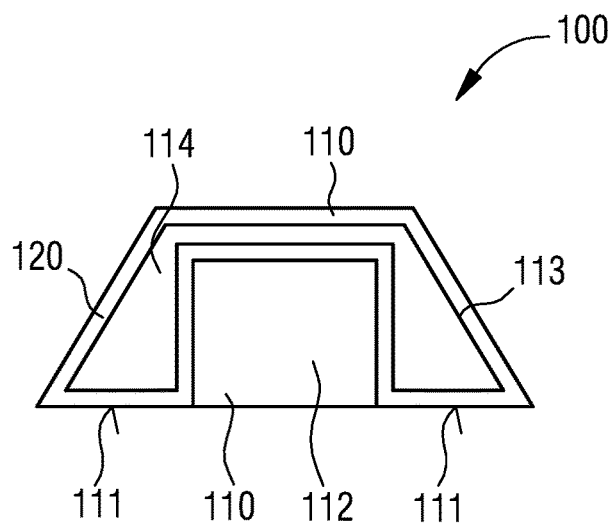
FIG. 2 schematically shows a plan view of a cover.

FIG. 2 shows a plan view of the cover 100 of FIG. 1, seen from the direction of the plate 120. The plate 120 is in this example represented transparently in its trapezoidal contours so that the body 110 that lies behind the plate 120 and comprises the recess 112 and the side surface 113 on which the plate 120 is arranged is likewise visible. A connecting region 114 may be provided between the body 110 and the plate 120.

Figure 3:
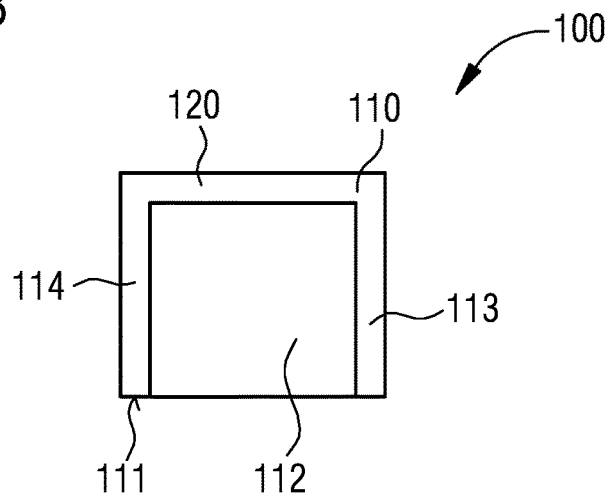
FIG. 3 schematically shows a plan view of a further example of the cover.

FIG. 3 shows a plan view of the cover 100, in which the body 110 is configured as a cuboid. The plate 120 is therefore also arranged rectangularly on the cuboid. The plate 120 is in this example represented transparently in its rectangular contours so that the body 110 that lies behind the plate 120 and comprises the recess 112 and the side surface 113 on which the plate 120 is arranged is likewise visible. A connecting region 114 may be provided between the body 110 and the plate 120.

Figure 4:
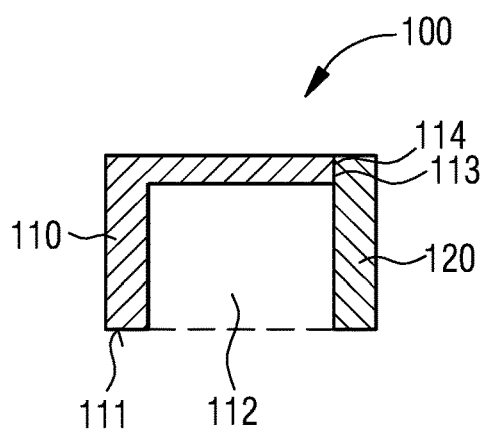
FIG. 4 schematically shows a cross section through a further example of the cover.

FIG. 4 shows a further cross section through the cover 100 according to FIG. 3, in which the body 110 is configured in the form of a cuboid. The recess 112, which is continued as far as the side surface 113, again starts from the lower side 111 of the body 110. The plate 120 is arranged on the side surface 113. A connecting region 114 may be provided between the body 110 and the plate 120.

Figure 5:
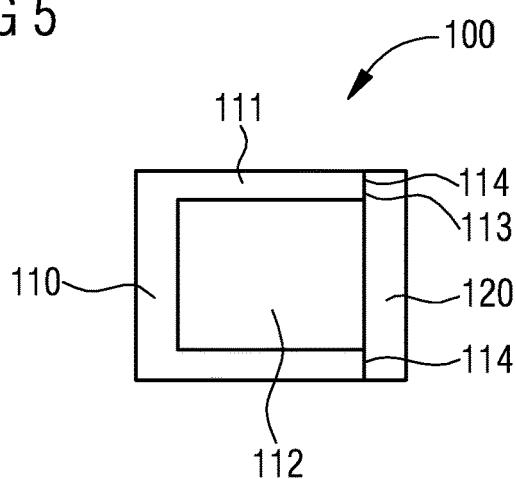
FIG. 5 schematically shows a plan view of a lower side of the cover.

FIG. 5 shows a plan view of the lower side 111 of the cover 100 with a cuboid body 110. The plate 120 is arranged on the side surface 113, and the recess 112 starts from the lower side 111. A connecting region 114 may be provided between the body 110 and the plate 120.

In the examples of FIGS. 1 to 5, the recess 112 may respectively have a different shape than as represented in the figures. The recess 112, however, every time starts from the lower side 111 of the body 110 and is continued as far as the side surface 113. Adjacent to the side surface 113, the plate 120 delimits the recess 112.

In one example, the body comprises glass or silicon. In this example, the body 110 may in particular consist of silicon dioxide or pure silicon. The body 110 may therefore be both transparent and transmissive for the light of a wavelength of an optoelectronic component.

The plate 120 may comprise a glass or consist of glass, and may therefore be transparent for visible light.

The plate 120 may comprise a plastic transparent for light of at least one wavelength or consist of a plastic transparent for light of at least one wavelength.

A first connecting region 114 may be arranged between the first material of the body 110 and the second material of the plate 120. The first connecting region 114 is likewise represented respectively in FIGS. 1 to 5, but is optional. The first connecting region 114 in this example comprises at least one subsurface of the side surface 113, as represented, for example, in FIG. 2. It is, however, likewise possible for the first connecting region 114 to comprise the entire side surface 113 and therefore the entire surface by which the plate 120 bears on the body 110, as represented in FIG. 3.

A connection consisting of the first material of the body 110 and the second material of the plate 120 may be arranged in the first connecting region. A material mixture of the materials of the body 110 and the plate 120 that firmly connects the body 110 and the plate 120 to one another is thus arranged in the connecting region.

A metal may be arranged in the connecting region 114. This metal may firmly connect to the body 110 and the plate 120 and thus also connect the body 110 to the plate 120.

A space-charge zone may be respectively arranged in the connecting region 114 and, starting from the connecting region 114, in the body 110 and the plate 120. A first space-charge zone is in this example arranged in the first material of the body 110, while a second space-charge zone is arranged in the second material of the plate 120. The space-charge zones may be oppositely charged and therefore lead to electrostatic attraction of the body 110 and of the plate 120, and therefore to a force-fit connection.

Hydrogen bonds between the material of the body 110 and the material of the plate 120 may be formed in the connecting region 114.

Figure 6:
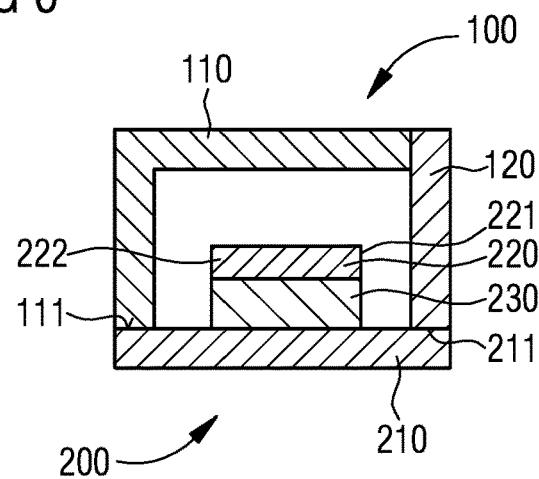
FIG. 6 schematically shows a cross section through an optoelectronic component having a cover.

FIG. 6 shows a cross section through an optoelectronic device 200, in which an optoelectronic component 220 is arranged on a substrate 210. The optoelectronic component 220 is in this example arranged on a carrier 230. The carrier 230 is arranged on the substrate 210. It may however also be provided that the optoelectronic component 220 is arranged without a carrier 230 directly on the substrate 210. Arranged above the light-emitting semiconductor chip, there is a cover 100 corresponding to the cover of FIGS. 4 and 5. A light exit side 221 of the optoelectronic component 220 in this example faces toward the plate 120 of the cover 100. The plate 120 is transparent for a radiation wavelength of the optoelectronic component 220 so that light which leaves the optoelectronic component 220 through the light exit side 221 transmits through the plate 120 and can therefore leave the optoelectronic device 200.

Instead of the cover 100, as represented in FIG. 6, one of the covers of FIGS. 1 to 3 may also be used for the optoelectronic device 200.

The size of the substrate 210 is dimensioned such that the lower side 111 of the cover 100 corresponds in its size exactly to the substrate 210. Alternatively, however, the substrate 210 may also have a different size, and may in particular be larger than the lower side 111 of the cover 100.

The substrate 210 and the cover 100 may connect with a force-fit.

The substrate 210 may be provided with electronic connection pads for the optoelectronic component 220. These may, in particular, be arranged on a side of the substrate 210 facing away from the cover 100 and therefore make the optoelectronic device 200 SMD-solderable.

The optoelectronic component 220 may be configured as a light-emitting semiconductor chip, in particular as a light-emitting diode (LED) or as a laser diode. If the optoelectronic component 220 is configured as a laser diode, a mirror structure may be provided on a backside 222 of the optoelectronic component 220, which lies opposite the light exit side 221.

A second connecting region 211 may be arranged between the substrate 210 and the cover 100. A connection consisting of a material of the substrate 210 and of the first or the second material of the cover 100 may be arranged in the second connecting region 211. Alternatively, a metal may be arranged in the second connecting region 211. The materials in the second connecting region 211 connect the substrate 210 to the cover 100 with a force-fit.

Figure 7:
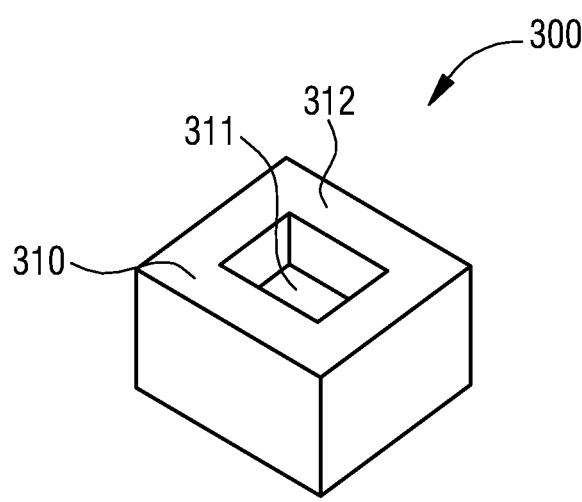
FIGS. 7 to 10 schematically show intermediate products during a method of producing a cover.

FIG. 7 shows an intermediate product 300 during a method of producing a cover for an optoelectronic component. The intermediate product 300 consists of a first material 310 and comprises a cavity 311 that starts from a first side 312 of the first material 310. The first material 310 is in this example cuboid, but may also have a different shape.

Figure 8:
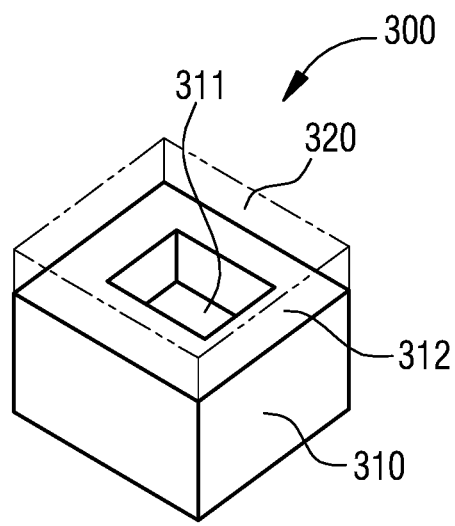

FIG. 8 shows the intermediate product 300 during the production method after a further method step in which a plate 320 has been applied and fastened on the first side 312 of the first material 310. The plate 320 is transparent for at least one wavelength, for example, a radiation wavelength of an optoelectronic component. The plate 320 in this example covers the cavity 311 fully so that the cavity 311 is closed by the plate 320. The plate 320 may be fastened on the first material 310 with a force-fit.

Figure 9:
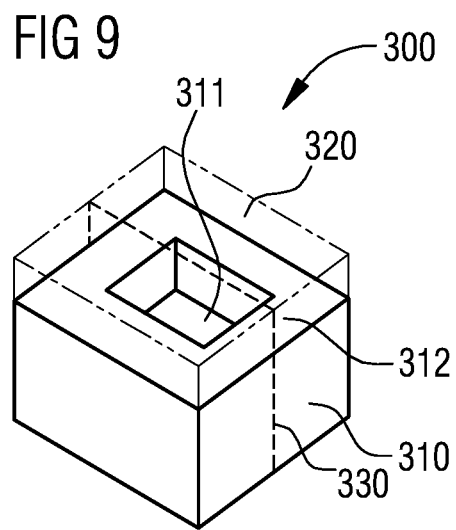

FIG. 9 shows a further plan view of the intermediate product 300 during the method of producing a cover. The intermediate product 300 of FIG. 9 in this example corresponds to the intermediate product 300 of FIG. 8. Indicated by a dashed line is a plane for a first saw cut 330, by which the first material 310 and the plate 320 can be cut through such that the saw cut 330 is carried out in the plane through the first material 310 and the plate 320, and in this example divides the cavity 311 into two regions.

Figure 10:
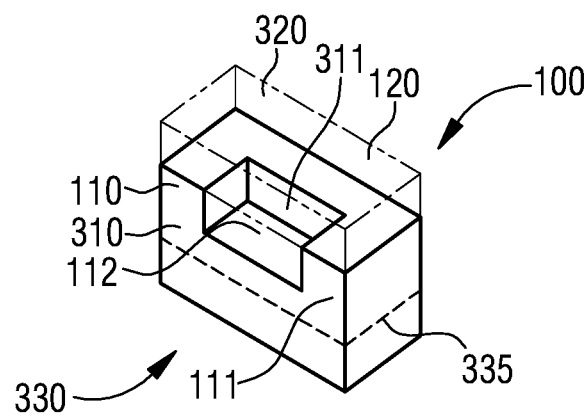

FIG. 10 shows the intermediate product 300 of FIGS. 7, 8 and 9 after the first saw cut 330 indicated in FIG. 9. By the saw cut, the cavity 311 has been opened such that the first material 310 comprises a recess 112 in the plane of the saw cut and starting from the plane of the saw cut. The plane of the saw cut in this example corresponds to the lower side 111 of a cover 100. The recess 112 is arranged starting from the lower side and partially closed by the halved plate 320, which therefore corresponds to the plate 120 of FIGS. 1 to 5. A further saw cut to reduce the size of the cover 100 is indicated below the recess 112 in a further plane 335. This is carried out such that it is not made through the cavity 311, or the recess 112, and is optional.

By the method shown in FIGS. 7 to 10, a cover 100 for an optoelectronic component can thus be provided in a straightforward way. Providing a first material 310 with a cavity 311, closing it with a plate 320 and subsequently dividing the cavity 311 into two recesses 112 by a saw cut, and thereby producing two covers 100, represents an advantageous method of producing a cover. In particular, two identically configured or mutually symmetrically configured covers 100 may thus be produced simply.

FIG. 11 shows a plan view of a further intermediate product 300 during production of covers for optoelectronic components. A first material 310 comprises a plurality of cavities 311 in a first row 313. First webs 314 are arranged between the cavities 311. A plate 320 that closes the cavities 311 in a similar way to FIG. 8 is arranged above the first material 310. The first saw cut 330 is made through the cavities 311 of the first row 313. At least one second saw cut 350 is made through a first web 314 such that the second saw cut 350 is not carried out through one of the cavities 311 of the first row 313. The intermediate product 300 comprises four cavities 311 in the first row 313 so that a total of eight covers for optoelectronic components can be provided by the saw cuts 330 and 350.

FIG. 12 shows a further intermediate product 300 during the method of producing covers for optoelectronic components. The first material 310 again comprises cavities 311 in a first row 313, in a similar way to FIG. 11. Below the first row 313, the first material 310 comprises cavities 315 in a second row 316. Arranged on the first material 310, there is a plate 320 by which the cavities 311, 315 are closed. A first saw cut 330 is made through the cavities 311 of the first row 313. A second saw cut 350 is made through webs 314 in a similar way to FIG. 11. This second saw cut 350 is in this example also made through webs between the cavities 315 in the second row 316. A third saw cut 360 is made such that it is carried out through the cavities 315 of the second row 316. A fourth saw cut 370 is made through the first material 310 between the first row 313 and the second row 316, and separates the first row 313 from the second row 316 such that none of the cavities 311 or 315 is touched during the fourth saw cut 370. The intermediate product 300, or the first material 310, comprises eight cavities 311, 315 so that sixteen covers can be produced with this method.

The intermediate product 300 may comprise further rows of cavities. Furthermore, more than four cavities 311, 315 may be arranged within a row 313, 316. The method is therefore suitable for rapidly and favorably providing a large number of covers for optoelectronic components.

The first material 310 may in this example comprise a glass or silicon, and may in particular consist of glass, silicon or silicon dioxide. In this example, the first material 310 may be provided as a wafer, the recesses 311, 315 being produced by selective material erosion of the wafer.

The connection between the first material 310 and the plate 320 may be produced by melting by a laser the first material 310 and the second material, bearing on the first material 310, of the plate 320 at the interface. The melt resulting therefrom subsequently solidifies as a connection between the first material 310 and the second material of the plate 320. As a result of the melting, the first material 310 and the second material of the plate 320 thus bond to form a melt consisting of the two materials, the melt subsequently solidifying and connecting the first material 310 and the second material of the plate 320 to one another with a force-fit.

The force-fit connection between the first material 310 and the plate 320 may be produced by arranging a metal between the first material 310 and the plate 320. The metal may be melted and subsequently solidified as a connection between the first material 310 and the second material of the plate 320 so that the metal produces a force-fit connection. The melting may in this example be carried out by introducing the first material 310 and the plate 320 into an oven or by a laser-welding process.

The force-fit connection between the first material 310 and the plate 320 may be produced by heating the first material 310 and the second material, bearing on the first material 310, of the plate 320. A voltage may subsequently be applied between the first material 310 and the second material of the plate 320. Because of the voltage, electrons are displaced from the first material 310 into the plate 320 or from the plate 320 into the first material 310. During subsequent cooling, space-charge zones may be formed adjacently in a connecting region between the first material 310 and the plate 320, inside the first material 310 and the plate 320. These space-charge zones are oppositely charged because of the displaced electrons, and lead to electrostatic attraction of the first material 310 and the plate 320.

The force-fit connection between the first material 310 and the plate may be produced by polishing the first material 310 on the first side 312 and the plate 320 on the side facing toward the first material 310. The polished sides of the first material 310 and of the plate 320 may be applied onto one another, the low roughness of the two sides leading to the formation of hydrogen bonds between the first material 310 and the plate 320.

To produce the optoelectronic device of FIG. 6, the substrate 210 of FIG. 6 having the optoelectronic component 220 may be provided. Subsequently, a cover 100 is produced by one of the methods described and positioned onto the substrate 210 and fastened such that the optoelectronic component 220 is arranged inside the cavity 311.

Fastening the cover 100 on the substrate 210 may be carried out by a laser-welding process or soldering process that may respectively be configured in a similar way to the methods described for application of the plate 320 on the first material 310.

Figure 13:
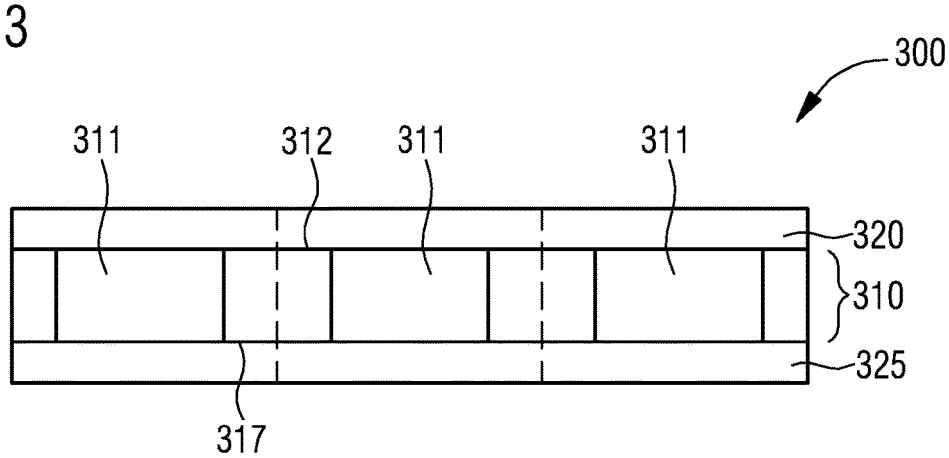
FIGS. 13 and 14 schematically show further intermediate products during production of a cover.

FIG. 13 shows a cross section through a further intermediate product 300 during production of a cover. A first material 310 again comprises a plurality of cavities 311 starting from a first side 312. The cavities 311 are in this example continued as far as a second side 317, the second side 317 corresponding to the side of the first material 310 lying opposite the first side 312. A plate 320 is arranged on the first side 312. A further plate 325 is arranged on the second side 317 so that the cavities 311 are respectively closed by a transparent plate 320, 325 both on the first side 312 and on the second side 317.

Figure 14:
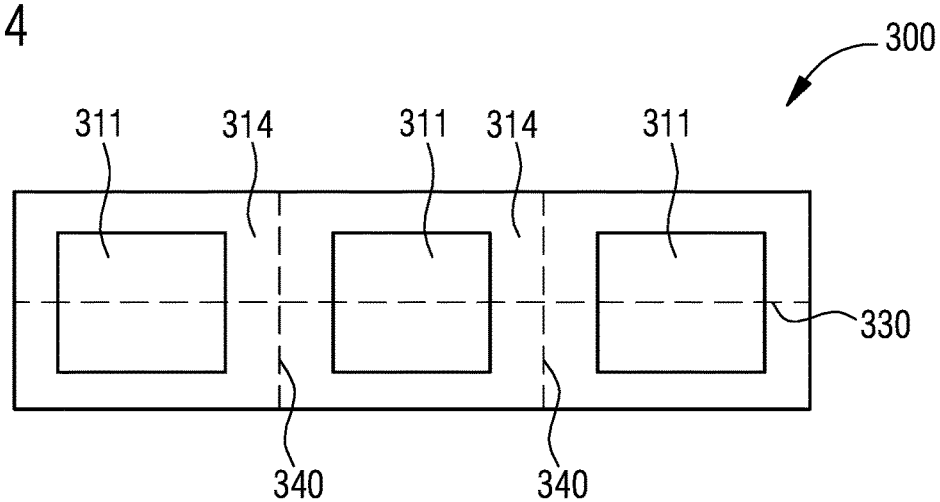

FIG. 14 shows a plan view of the intermediate product 300 of FIG. 13. By a first saw cut 330 through the cavities 311 and second saw cuts 340 through webs 314 between the cavities 311, the intermediate product 300 can again be separated into individual covers.

Figure 15:
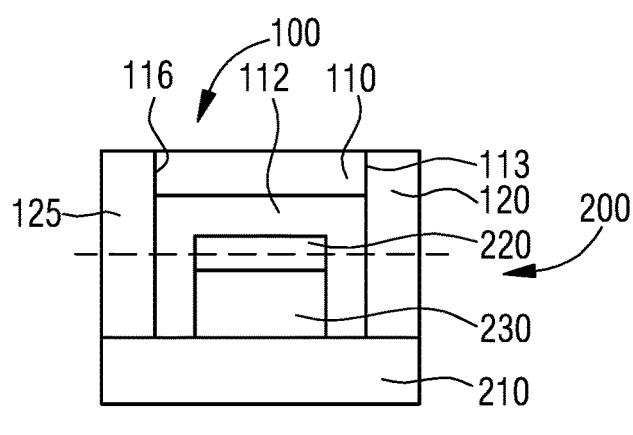
FIG. 15 schematically shows a light-emitting component having a cover with two transparent sides.
Figure 16:
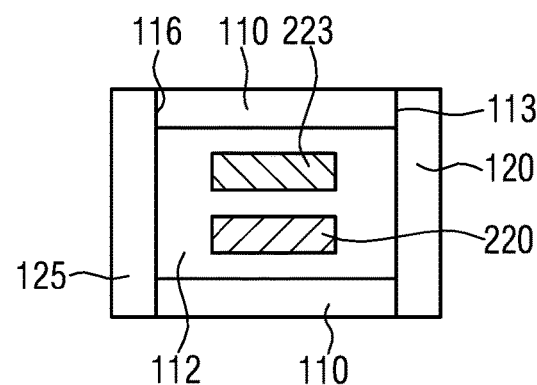
FIG. 16 schematically shows a further cross section through this optoelectronic component.

FIG. 15 shows an optoelectronic device 200 having such a cover 100 in which a further plate 125 is arranged on a further side surface 116 facing away from the side surface 113. In other regards, the cover 100 of FIG. 15 corresponds to the cover 100 of FIG. 4. Such a cover is suitable for an optoelectronic device in which either the optoelectronic component 220 can emit light in two opposite directions, or in which, besides the optoelectronic component 220, a further optoelectronic component 223 with an opposite emission direction is arranged inside the optoelectronic device 200. A cross section through such a component is represented in FIG. 16. The optoelectronic device 200 of FIG. 16 comprises an optoelectronic component 220 and a further optoelectronic component 223, respectively with opposite emission directions. The optoelectronic component 220 in this example emits in the direction of the plate 120, while the further optoelectronic component 223 emits in the direction of the further plate 125.

The further optoelectronic component 223 may, as an alternative, be configured not as a light-emitting component but as a light detector, and may receive and detect light through the further plate 125. By a circuit integrated into the optoelectronic device 200, a variation of the luminosity of the optoelectronic component 220 may be controlled on the basis of the light detection inside the further optoelectronic component 223. In this way, such devices may be used as signal-transmitting devices.

The connection of the further plate 125 to the body 110 is in this example carried out in a similar way to the possibilities already described of connecting the plate 120 to the body 110, or the plate 320 to the first material 310.

Although our covers, devices and methods have been illustrated and described in detail with the aid of preferred examples, this disclosure is not restricted by the examples disclosed, and other variants may be derived therefrom by those skilled in the art without departing from the protective scope of the appended claims.

This application claims priority of DE 10 2017 110 317.1, the subject matter of which is incorporated herein by reference.

The invention claimed is:

1. A method of producing a cover for an optoelectronic component comprising:
   providing a first material, the first material comprising a cavity, the cavity starting from a first side of the first material;
   applying and fastening a plate on the first side of the first material, the plate consisting of a second material and being transparent for at least one radiation wavelength; and
   making a first saw cut such that the cavity is separated into two regions, the first saw cut being carried out both through the first material and through the plate.

2. The method as claimed in claim 1, wherein the first saw cut is carried out perpendicularly to the first side.

3. The method as claimed in claim 1, wherein the first material comprises a plurality of cavities in a first row, first webs are arranged between the cavities, the first saw cut is made through the cavities of the first row, and at least one second saw cut is made through a first web such that the second saw cut is not made through one of the cavities of the first row.

4. The method as claimed in claim 3, wherein the first material comprises a plurality of cavities in a second row, and a third saw cut is made through the cavities of the second row.

5. The method as claimed in claim 1, wherein the connection between the first material and the plate is produced by melting by a laser the first material and the second material, bearing on the first material, of the plate at an interface and subsequently solidifying a melt resulting therefrom as a connection between the first material and the second material of the plate.

6. The method as claimed in claim 1, wherein the connection between the first material and the plate is produced by arranging a metal between the first material and the plate, melting the metal and subsequently solidifying it as a connection between the first material and the plate.

7. The method as claimed in claim 1, wherein the connection between the first material and the plate is produced by heating the first material and the second material, bearing on the first material, of the plate, subsequently applying a voltage between the first material and the second material of the plate, wherein, because of the voltage, electrons are displaced from the first material into the second material of the plate or electrons are displaced from the second material of the plate into the first material, during subsequent cooling, oppositely charged space-charge zones being formed in the first material and respectively in the second material of the plate because of the displaced electrons, the space-charge zones leading to mutual electrostatic attraction of the first material and the plate.

8. The method as claimed in claim 1, wherein the connection between the first material and the plate is produced by polishing the first material on the first side and the plate on the side facing toward the first material, the polished sides of the first material and the plate being applied onto one another and hydrogen bonds being formed because of a low roughness of the two sides.

9. A method of producing an optoelectronic device comprising:
   providing a substrate having an optoelectronic component;
   producing the cover as claimed in the method of claim 1; and
   placing and fastening the cover on the substrate such that the optoelectronic component is arranged inside the cavity.

10. The method as claimed in claim 9, wherein the fastening of the cover on the substrate is carried out by a laser-welding process or soldering process.

* * * * *